United States Patent
Helfman et al.

(10) Patent No.: US 7,321,322 B2
(45) Date of Patent: Jan. 22, 2008

(54) PATTERN-DRIVEN, MESSAGE-ORIENTED COMPRESSION APPARATUS AND METHOD

(75) Inventors: Nadav Binyamin Helfman, Binyamina (IL); Guy Keren, Haifa (IL); Alex Drobinsky, Netanya (IL)

(73) Assignee: SAP Portals Israel Ltd., Ra'Anana (IL)

(*) Notice: Subject to any disclaimer, the term of this patent is extended or adjusted under 35 U.S.C. 154(b) by 0 days.

(21) Appl. No.: 11/269,148

(22) Filed: Nov. 7, 2005

(65) Prior Publication Data
US 2006/0139187 A1 Jun. 29, 2006

Related U.S. Application Data

(63) Continuation of application No. PCT/IL2004/000377, filed on May 6, 2004.

(60) Provisional application No. 60/468,661, filed on May 8, 2003.

(51) Int. Cl.
*H03M 7/30* (2006.01)
(52) U.S. Cl. ........................... 341/87; 341/51; 341/106
(58) Field of Classification Search ................... 341/51, 341/87, 106
See application file for complete search history.

(56) References Cited

U.S. PATENT DOCUMENTS

| | | | |
|---|---|---|---|
| 4,862,167 A * | 8/1989 | Copeland, III | 341/107 |
| 5,572,206 A * | 11/1996 | Miller et al. | 341/51 |
| 5,606,317 A | 2/1997 | Cloonan et al. | |
| 5,640,563 A | 6/1997 | Carmon | |
| 5,737,594 A | 4/1998 | Williams | |
| 5,822,746 A | 10/1998 | Williams | |
| 5,990,810 A | 11/1999 | Williams | |
| 6,038,593 A | 3/2000 | Huckins | |
| 6,054,943 A * | 4/2000 | Lawrence | 341/87 |
| 6,115,384 A | 9/2000 | Parzych | |
| 6,163,811 A | 12/2000 | Porter | |
| 6,230,160 B1 | 5/2001 | Chan et al. | |
| 6,269,402 B1 | 7/2001 | Lin et al. | |
| 6,333,932 B1 | 12/2001 | Kobayasi et al. | |
| 6,415,329 B1 | 7/2002 | Gelman et al. | |
| 6,445,313 B2 | 9/2002 | Ahn | |

(Continued)

FOREIGN PATENT DOCUMENTS

WO  WO 99-67886  12/1999

OTHER PUBLICATIONS

Manber, Udi et al., "A Text Compression Scheme That Allows Fast Searching Directly in the Compressed File", *Department of Computer Science*, Mar. 1993, pp. 1-12, Technical Report #93-07, University of Arizona, Tucson, Arizona.

(Continued)

*Primary Examiner*—Khai M. Nguyen
(74) *Attorney, Agent, or Firm*—Buckley, Maschoff & Talwalkar LLC

(57) ABSTRACT

A compression and decompression method and apparatus comprising at least one data source providing a stream of data to at least one data destination, employing at least one pattern classifier processing the stream of data of the at least one data source into a single stream of messages and generating at least one pattern event, a message encoder and a message decoder changing an internal state in response to the at least one pattern event.

26 Claims, 2 Drawing Sheets

U.S. PATENT DOCUMENTS

| | | |
|---|---|---|
| 6,449,658 B1 | 9/2002 | Lafe et al. |
| 6,480,123 B2 | 11/2002 | Tsutsui et al. |
| 6,553,141 B1 | 4/2003 | Huffman |
| 6,667,700 B1 | 12/2003 | McCanne et al. |
| 2001/0039585 A1 | 11/2001 | Gupta |

OTHER PUBLICATIONS

Manber, Udi et al., "Finding Similar Files in a Large File System", *Department of Computer Science*, Oct. 1993, pp. 1-10, Technical Report #93-33, University of Arizona, Tucson, Arizona.

Manber, Udi et al., "GLIMPSE: A Tool to Search Through Entire File Systems", *Department of Computer Science*, Oct. 1993, pp. 1-10, Technical Report #93-34, University of Arizona, Tucson, Arizona.

Mellia, Marco et al.; "TCP Smart-Framing: using smart segments to enhance the performance of TCP", Dipartimento di Elettronica, Politecnico di Torino, 10129 Torino, Italy, pp. 1708-1712, date unknown.

Andy McFadden Hacking Data Compression Lesson 1 Introduction, Internet Article Oct. 30, 2002—XP 002379865, 8 pages.

M Nelson LZW Data Compression—Dr. Dobb's Journal, M & T published Redwood City, CA US Oct. 1999, 19 pages.

Microsoft Technet—Overview of Deploying a Managed Environment Process—Mar. 28, 2003 http://technet2.microsoft.com/WindowsServer/en/library/4a05be6b-09fd-444f-ac6f-c2292f4931961033.mspx?=true, 3 pages.

* cited by examiner

PATTERN-DRIVEN, MESSAGE-ORIENTED COMPRESSION APPARATUS AND METHOD

This application is a continuation of PCT/IL2004/000377 filed May 6, 2004, which claimed the benefit of U.S. Provisional Application No. 60/468,661, filed on May 8, 2003.

BACKGROUND OF THE INVENTION

1. Field of the Invention

The present invention relates generally to lossless data compression. More particularly, the present invention relates to repeating compression tasks of data generated by similar sources and possible enactments of universal data compression to utilize the attributes of such sources.

2. Discussion of the Related Art

The performance of data compression depends on what can be determined about the characteristics of the source. When given an incoming data stream, its characteristics can be used to devise a model for better prediction of forecoming strings. If such characteristics are determined prior to compression, a priori knowledge of source characteristics can be obtained, providing a significant advantage and allowing for more efficient compression. However, in most cases a priori knowledge of the source characteristics cannot be determined. This often occurs in real-world applications where properties of a source are dynamic. In particular, the symbol probability distribution of a source usually changes along the time axis.

Some substitutional compression processes can be used to compress such data, since they do not require a priori knowledge of the source properties. Such processes can adaptively learn the source characteristics on the fly during the coding phase. Moreover, the decoder can regenerate the source characteristics during decoding, so that characteristics are not required to be transmitted from encoder to decoder.

These compression processes can be applied to universal data content and are sometimes called universal data compression algorithms. The LZ compression algorithm is a universal compression algorithm that is based on substitutional compression. The main reason for LZ compression algorithm to work universally is the adaptability of the dictionary to the incoming stream. In general, the LZ compression algorithm processes the input data stream and then adaptively constructs two identical buffers of a dictionary at both the encoder and the decoder. Without explicit transmission of the dictionary, this building process is performed during the coding and decoding of the stream, and the dictionary is updated to adapt to the input stream. Matching procedures using this adapted dictionary are expected to give the desirable compression result, since the dictionary reflects incoming statistic quite accurately. Many applications, which may benefit from data compression, have repeating usage patterns. Examples for such applications are: a client/server application working session which repeats frequently, or a periodic remote backup process. There is therefore a need for a priori knowledge about the source data.

BRIEF SUMMARY OF THE INVENTION

The present invention regards a compression apparatus that includes a usage pattern classifier, an encoder, a decoder and a signaling mechanism of classified usage patterns between the encoder and the decoder. The input stream is delivered to the encoder as messages, which are detected by the classifier. The encoder matches each message with one or both of (a) a dictionary of previously detected streams and (b) a buffer of most N recent messages. This matching results in (a) detection of new repeating strings, (b) a collection of "badly compressed message segments" for future "off-line" analysis, and (c) encoder messages in which content is replaced with a token that includes one or both of (a) references to existing strings in the dictionary with the length used from the beginning of the stream, and (b) a location in the most N recent messages buffer. The location in the most N recent messages buffer is also considered as the declaration of a new string in the dictionary. Offline learning is triggered by a break in the transmitted data detected by the classifier. A pause in the current session results in "internal session redundancy analysis"—matching all "badly compressed message" segments from the current session resulting in (a) new strings in the dictionary, and (b) a reminder of message segments saved for future "cross session" redundancy analysis. During the process, the dictionary is "aged"—strings are removed to make room for new items using some "aging policy" process. The end of the current session results in a cross session redundancy analysis which resolves the reminder segment left from the internal session redundancy analysis process. Several versions of the data structure may co-exist to enable analysis in the background. In this case an identifier of the data structure version used is added to the format of the encoded message. An actual realization of the mechanism may also include state structures signatures exchange between the encoder and the decoder, and data structure disk persistency for initialization and recovery.

In accordance with one aspect of the present invention, there is provided a compression or decompression apparatus comprising at least one data source for providing a stream of data to at least one data destination; at least one pattern classifier for processing the stream of data of the at least one data source into a single stream of messages and for generating at least one pattern event, a message encoder and a message decoder for changing an internal state in response to the at least one pattern event. The stream of messages can comprise continuous content segments in time, application layer or proximity. The encoder internal data structure comprises at least one string dictionary, and a store for most recent messages comprising at least one most recent message. The at least one most recent message is matched with at least one string within the at least one string dictionary. The apparatus can further comprise a pattern classifier for detecting a pattern event in the data stream. The pattern event can be a silence in the session event or an end session event. The encoder or decoder further comprises a badly compressed message segments store for processing at least one badly compressed message into at least one new dictionary string in response to a silence in session event.

In accordance with another aspect of the present invention, there is provided a compression or decompression method comprising at least one data source providing a stream of data to at least one data destination, employing at least one pattern classifier processing the stream of data of the at least one data source into a single stream of messages and generating at least one pattern event, a message encoder and a message decoder changing an internal state in response to the at least one pattern event. The method can further comprise a step of matching messages from a store for most recent messages within the encoder internal data structure with strings stored in a string dictionary. The method can further comprise the step of the pattern classifier detecting a pattern event in the data stream. The method can further comprise the step of processing a badly compressed message segments store within the encoder or decoder into new dictionary strings in response to a silent in session event. The step of matching can comprise the matching of a hash value of a fixed size prefix within the matched context.

DETAILED DESCRIPTION OF THE INVENTION

Message: a continuous content segment with time, application layer or other proximity as detected by the classifier. Message is the basic unit of processing and encoded and decoded as an atomic operation.

Session: a stream of Messages with time, application layer or other proximity as detected by the classifier, all generated by the same collection data source. A session is associated with begin session and end session events.

Session silence: a time, application layer or other pause in the stream of messages in a session.

The present invention provides a method and apparatus that adds a prior assumption of the existence of usage patterns to universal data compression methods. Two identical data structures are maintained in the encoder and the decoder, based on the content of the stream with the addition of signals of detected patterns sent from the encoder to the decoder. The history covered by the data structures of the current invention is from the initial usage of the application. The compression ratio achieved may be in an order of about 1-3 magnitudes larger than in common universal data compression while the present mechanism is highly efficient, and suitable for real-time communication.

Figure 1:
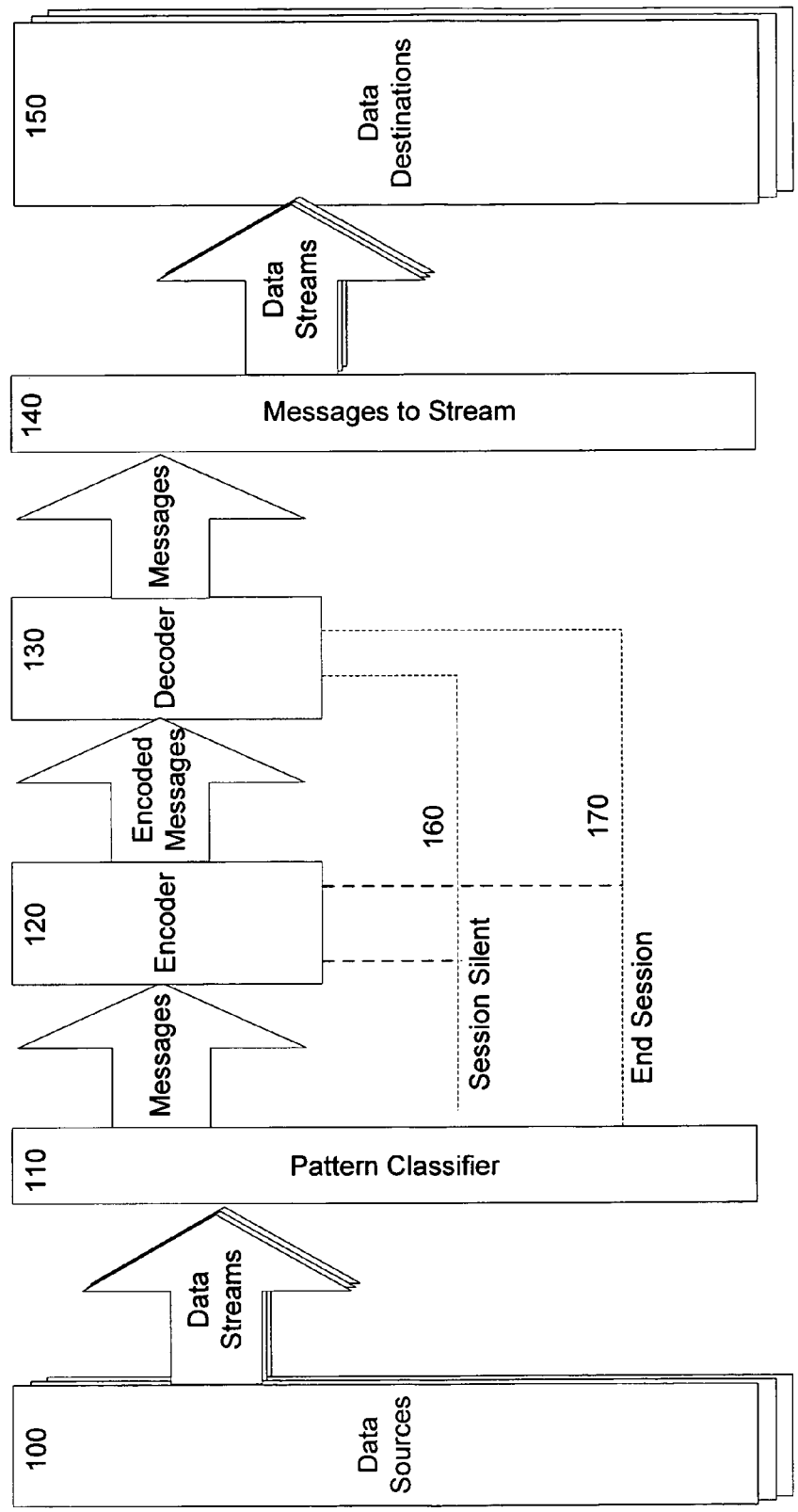
FIG. 1 is a block diagram that illustrates a data compression system with a pattern classifier, an encoder, a decoder and a classified patterns events signaling mechanism, in accordance with a preferred embodiment of the present invention.

Referring to FIG. 1, a collection of similar or logically related data sources 100 is producing data streams, which are processed by a pattern classifier 110 into a stream of messages. Each message is processed by an Encoder 120 as an atomic unit, providing a stream of encoded messages. A Decoder 130 decodes each message proving the original stream of messages, which is processed by the messages to streams unit 140 into streams flowing to the associated collection of destinations 150. The pattern classifier 110 also detects the Session Silent and End Session events, which are signaled both to the Encoder 130 and the Decoder 150, triggering a modification of the encoder/decoder mutual data structure, named context in this text. The constituent components of the present invention as described in FIGS. 1-2 can operate within a computerized system having one or more central processing unit. Persons skilled in the art will appreciate that the present invention can be operated and applied in many computerized systems, including such systems associated with personal and business computers, network environments, and the like.

Figure 2:
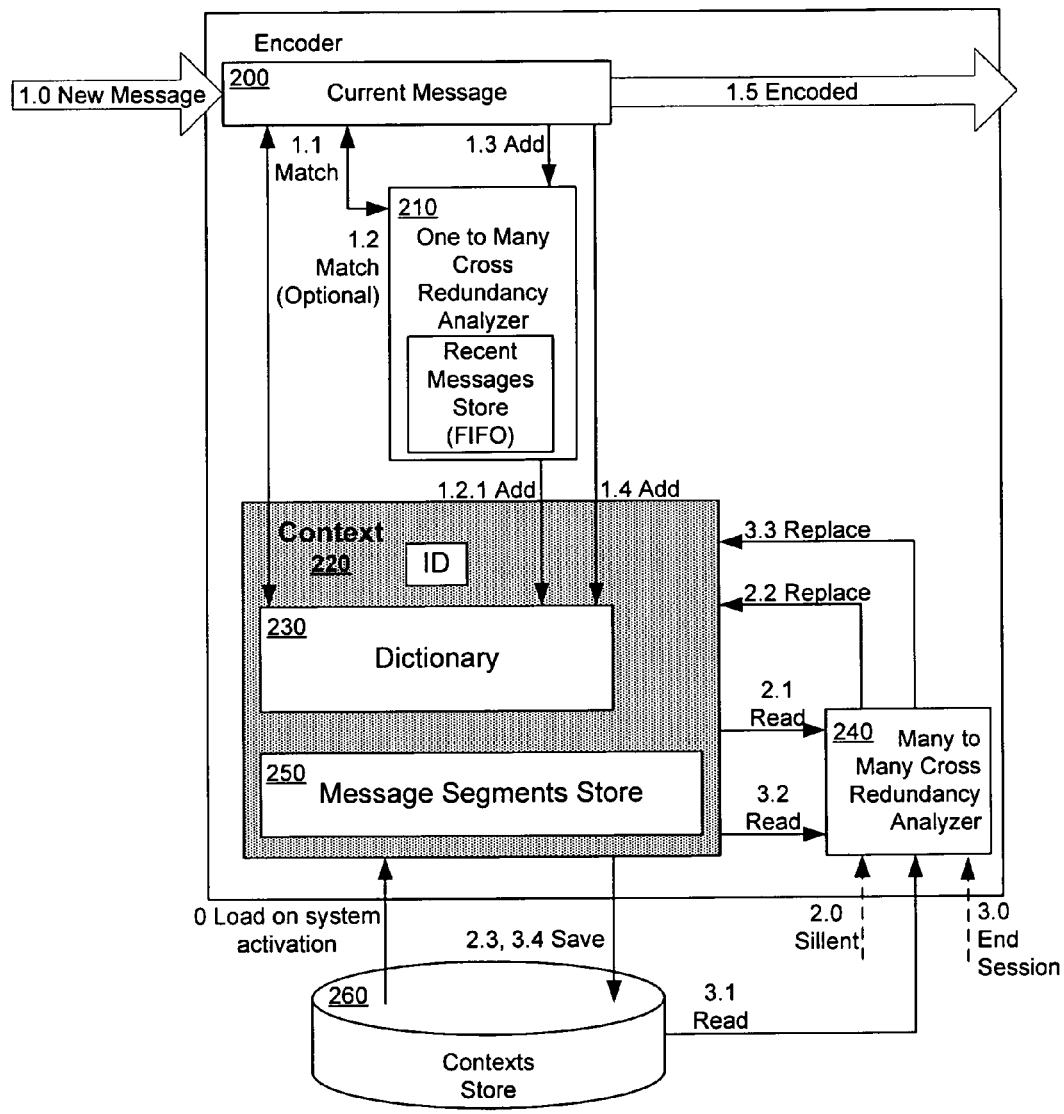
FIG. 2 is a block diagram that illustrates the internal structure of the encoder and operation scenarios, in accordance with a preferred embodiment of the present invention.

Referring now to FIG. 2, the internal structure of an Encoder is described. The Encoder operates as follows: (a) upon activation of the system (step 0), the most recent context is loaded into a memory structure 220 from a contexts store 260. The context includes a Dictionary of strings 230 and a store of message segments 250. The dictionary 230 is indexed by two methods: (a)—"fingerprint"—a hash value calculated on a fixed size prefix of the string by any (efficient) hashing method such as UHASH, and (b) an identifier. The identifier can be a sequential numerator, a randomly generated identifier or any other like identifier suitable for indexing a dictionary. In actual implementations an ID (and context signature) may be associated with each Context data structure to match with the remote instance for synchronization validation. When a message is handed to the encoder (step 1.0), it is stored in the current message data structure. For every location in the message, a fingerprint value is calculated in a particular manner, which can be identical to the dictionary string fingerprints described above. The fingerprint values are used to query (step 1.1), Dictionary 230, and (optionally for this massage) (step 1.2) the N most recent message store 215 using a one to many cross redundancy analyzer 210. Any match with dictionary 230 is used as an ESCAPE code (string id, length) token in the encoded message. Any match with the message with a defined minimal length is used as an ESCAPE code (relative message id in the store, location in message, length). In addition, the matched segment is added to the dictionary (step 1.2.1) on both sides. Badly compressed segments larger than a given threshold (step 1.4) are added to a message segments store data structure. A session silent event (step 2.0) signaled by the pattern classifier activates a many-to-many cross redundancy analyzer 240. This analyzer is handed the current active context (step 2.1) and replaces said active context after the analysis with a new active context (step 2.2) while saving the new context also to the context in the contexts store (step 2.4). An End session event (step 3.0), signaled by the pattern classifier, activates the many-to-many cross redundancy analyzer unit to read previous (step 3.1) and current (step 3.2) context and to resolve items in the message segments store into a new context (step 3.3) with disk persistency (step 3.4). Both one-to-many analyzer 210 and many-to-many analyzer 240 operate by mapping each fingerprint value into a list of its instances.

The process in the Decoder is similar in the opposite direction. The Decoder has the same context data structures, which are used to resolve back tokens into context segments in methods, which are known to persons skilled in the related art.

One embodiment of the present invention is provided as follows: A data Source of a web-based application, running on a computer system with one CPU, is generating replies (in response to requests from a web client application, for example).

The stream of communication might have the following pattern. Packets are transmitted contiguously with a delay of less than 50 msec (milliseconds) between each packet, until the content the web based application "wishes" to transmit to the Destination (the web client) is entirely transmitted. A pattern classifier module running on the network gateway computer captures the stream from the Source to the Destination, via a method such as redirecting the traffic to a local listening TCP port using DNAT (Destination network address translation), which is a well-known networking method. After a period of more than 50 msec from the previous packet, the classifier receives the content of a new packet of the stream and starts buffering the content until the flow of packet stops for more than 50 msec. Then, the content is packed with meta-information regarding the original stream into a message data structure and delivered to the Encoder. The Encoder matches the message with a string of previously detected strings using a method such as comparing signatures of fixed length segments in the message. Then, the encoder matches the message with a buffer of N previously transmitted messages for repeating strings. Any segment whose size is more than 10% of the message (or some other measure) and which is not covered by the dictionary or previous messages is added into a segments store. Every matched string is replaced with an escape-char (a sequence to alert a decoder that this is a replaced string) and an index value. The encoded message is transmitted into the other side and handled by the Decoder, which is running on the gateway computer to the Destination's network. The Decoder replaces every escape-char and index with the original string and transmits the content into the destination using a local TCP connection, which matches the meta-information in the Message. In addition, it adds segments, that are larger than 10% of the message into a segments store. This process repeats for every reply message from the web browser to the web client. When the user "takes a break" of more then 120 seconds (for example) and stops generating new requests, the web browser will eventually also stop generating new replies. A software timer in the classifier, which is reset and retriggered to generate an event within 120 seconds (or some other period), after generating every message, eventually triggers a "stream-silence" event. The event is delivered to both the Encoder and the Decoder. In reaction to the event, both the Encoder and the Decoder analyze the content of the segments store. Each string that is larger than 32 bytes (or some other threshold length) and repeats at least twice is added to the strings dictionary. Having a new version of the strings dictionary, the internal state of both the encoder and the decoder is changed in reaction to the stream-silence event.

What is claimed is:

1. Within a computerized environment having at least one central processing unit for processing incoming data to perform data compression, a method comprising:
   providing a stream of incoming data from at least one data source directed to at least one data destination;
   processing the stream of incoming data into a single stream of messages;
   analyzing the single stream of messages to detect one or more session events in the single stream of messages; and
   compressing the single stream of messages with an encoder to generate a stream of encoded messages representing a compressed version of the incoming data stream, wherein the encoder is configured to encode the single stream of messages with respect to one or more internal states of the encoder associated with the one or more session events.

2. The method of claim 1, wherein the single stream of messages comprises content segments continuous in one or more of time, application layer or proximity.

3. The method of claim 1, further comprising matching messages from a store for most recent messages within the encoder internal data structure with strings stored in a string dictionary.

4. The method of claim 3, wherein matching comprises matching a hash value of a fixed size prefix within a matched context.

5. The method of claim 1, further comprising detecting a pattern event in the data stream using the pattern classifier.

6. The method of claim 5, wherein the pattern event comprises one or more of a silence in the session event or an end session event.

7. The method of claim 1, further comprising processing a badly compressed message segments store within the encoder into new dictionary strings in response to a silence in session event.

8. The method of claim 1 further comprising:
   receiving the stream of encoded messages with a decoder; and
   decompressing the stream of encoded messages into an uncompressed stream of messages comprising uncompressed message content of the single stream of messages, wherein the decoder is configured to decode the single stream of messages with respect to one or more internal states of the decoder associated with the one or more session events.

9. The method of claim 8, further comprising processing a badly compressed message segments store within the decoder into new dictionary strings in response to a silence in session event.

10. Within a computerized environment having at least one central processing unit for processing incoming data to perform data compression, an apparatus comprising:
    at least one data source that provides a stream of incoming data directed to at least one data destination;
    a pattern classifier for processing the stream of incoming data into a single stream of messages, wherein the processing comprises detecting one or more session events in the single stream of messages; and
    an encoder configured to compress the single stream of messages into a stream of encoded messages representing a compressed version of the incoming data stream, wherein the encoder is configured to encode the single stream of messages with respect to one or more internal states of the encoder associated with the one or more session events.

11. The apparatus of claim 10, wherein the single stream of messages comprises content segments continuous in one or more of time, application layer or proximity.

12. The apparatus of claim 10, wherein an encoder internal data structure comprises:
    at least one string dictionary, and
    a store for most recent messages comprising at least one most recent message.

13. The apparatus of claim 12, wherein the at least one most recent message is matched with at least one string within the at least one string dictionary.

14. The apparatus of claim 10, wherein the pattern classifier is a pattern classifier that detects pattern events in the incoming data stream.

15. The apparatus of claim 14, wherein pattern events include one or more of a silence in a session event or an end session event.

16. The apparatus of claim 10, wherein the encoder further comprises a badly compressed message segments store for processing at lea one badly compressed message into at least one new dictionary string in response to a silence in session event.

17. The apparatus of claim 10, further comprising:
    a decoder configured to receive the stream of encoded messages, wherein the decoder is configured to decompress the stream of encoded messages into an uncompressed stream of messages comprising uncompressed message content of the single stream of messages, and wherein the decoder is configured to decode the single stream of messages with respect to one or more internal states of the decoder associated with the one or more session events.

18. The apparatus of claim 17, wherein the decoder further comprises a badly compressed message segments store for processing at least one badly compressed message into at least one new dictionary string in response to a silence in session event.

19. Within a computerized environment having at least one central processing unit for processing incoming data to perform one of compression or decompression, a method comprising:
 providing a stream of incoming data from at least one data source directed to at least one data destination;
 processing the stream of incoming data using a pattern classifier into a single stream of messages;
 generating one or more pattern events;
 for compression, encoding messages using a message encoder that changes an internal state in response to the at least one pattern event;
 for decompression, decoding messages using a message decoder that changes an internal state in response to the at least one pattern event; and
 processing a badly compressed message segments store within the encoder or decoder into new dictionary strings in response to a silence in session event.

20. The method of claim 19, wherein the single stream of messages comprises content segments continuous in one or more of time, application layer or proximity.

21. The method of claim 19, further comprising matching messages from a store for most recent messages within the encoder internal data structure with strings stored in a string dictionary.

22. The method of claim 21, wherein matching comprises matching a hash value of a fixed size prefix within a matched context.

23. The method of claim 19, further comprising detecting a pattern event in the data stream using the pattern classifier.

24. The method of claim 23, wherein the pattern event comprises one or more of a silence in the session event or an end session event.

25. Within a computerized environment having at least one central processing unit for processing incoming data to perform one of compression or decompression, a method comprising:
 providing a stream of incoming data from at least one data source directed to at least one data destination;
 processing the stream of incoming data using a pattern classifier into a single stream of messages;
 generating one or more pattern events;
 for compression, encoding messages using a message encoder that changes an internal state in response to the at least one pattern event, wherein encoding messages includes matching messages from a store for most recent messages within an encoder internal data structure with strings stored in a string dictionary; and
 for decompression, decoding messages using a message decoder that changes an internal state in response to the at least one pattern event.

26. Within a computerized environment having at least one central processing unit for processing incoming data to perform one of compression or decompression, an apparatus comprising:
 at least one data source that provides a stream of incoming data directed to at least one data destination;
 a pattern classifier for processing the stream of incoming data into a single stream of messages;
 a pattern event generator for generating at least one pattern event;
 a message encoder that changes an internal state in response to the at least one pattern event, the message encoder further comprising an encoder internal data structure comprising:
  at least one string dictionary, and
  a store for most recent messages comprising at least one most recent message; and
 a message decoder that changes an internal state in response to the at least one pattern event.

* * * * *